United States Patent [19]

Sato et al.

[11] 4,228,447
[45] Oct. 14, 1980

[54] SUBMICRON CHANNEL LENGTH MOS INVERTER WITH DEPLETION-MODE LOAD TRANSISTOR

[75] Inventors: Shuichi Sato, Beaverton; Tadanori Yamaguchi, Hillsboro, both of Oreg.

[73] Assignee: Tektronix, Inc., Beaverton, Oreg.

[21] Appl. No.: 11,598

[22] Filed: Feb. 12, 1979

[51] Int. Cl.² .................................. H01L 27/02
[52] U.S. Cl. ........................... 357/42; 357/23; 357/41; 357/46; 357/55; 357/56
[58] Field of Search ............... 357/23, 41, 42, 46, 357/55, 56

[56] References Cited
U.S. PATENT DOCUMENTS 3,823,352  7/1974  Pruniaux et al. ................. 357/56

OTHER PUBLICATIONS

IEEE J. Solid State Cir., vol. SC-11, No. 4, Aug. 1976, pp. 443-452, Lin et al.
Research and Education Assn., N. Y. (1972), p. 602, Fogiel.

Primary Examiner—Edward J. Wojciechowicz
Attorney, Agent, or Firm—John D. Winkelman

[57] ABSTRACT

An improved, high speed n-channel MOS inverter structure including a self-aligned silicon gate depletion-mode load device integrated in series with a nonplanar, submicron channel enhancement-mode switching transistor. The enhancement-mode switching device is formed on a field of the substrate that includes an elevated, plateau region joined to a surrounding planar area by a slope. The MOS load transistor is formed on an adjoining planar portion of the surface. The process for fabricating the devices features successive ion implation of boron and arsenic through an oxide layer that includes a smoothly tapered "beak" formed by a local oxidation technique.

5 Claims, 9 Drawing Figures

SUBMICRON CHANNEL LENGTH MOS INVERTER WITH DEPLETION-MODE LOAD TRANSISTOR

BACKGROUND OF THE INVENTION

The present invention relates generally to metal-oxide-semiconductor (MOS) field effect devices, and more particularly to an improved, high speed n-channel MOS inverter structure of the type combining an enhancement-mode driver and a depletion-mode load. The invention also concerns a particularly suitable method for fabricating such a device.

The most basic MOS digital logic circuit is the inverter, which performs the logical NOT function. An elementary MOS inverter consists of an active switching device, or driver, in series with a load device. Almost without exception the load device, like the driver, is an MOS transistor. Inverters can be designed using n-channel or p-channel technologies, with a choice of enhancement-mode or depletion-mode devices for both the driver and load transistors. For most integrated circuit designs the choice of drivers is limited to enhancement-type devices for practical reasons—the use of a depletion-mode driver would not permit voltage polarity matching between direct-coupled stages. The combination of a depletion-type load with an enhancement driver requires the least substrate surface area and hence provides the greatest circuit density, a significant attraction in LSI (large scale integration) applications. Where high performance is required, n-channel MOS technologies have largely replaced p-channel varieties because of the latter's lower speed and larger equivalent size.

The push for higher performance and greater circuit density has resulted in the development of several new n-MOS technologies in recent years. These include a silicon gate process called HMOS (for high-performance MOS) that produces scaled-down versions of conventional n-MOS devices; a planar double-diffusion process called DMOS; and VMOS, another double-diffusion process featuring anistropic etching of a V-shaped groove in the silicon chip. All three have been used to provide enhancement/depletion (e/d) type inverters that include a conventional depletion-mode load device with a relatively long, 5 micron channel under the gate, integrated in series with a short channel enhancement mode driver. None of the processes is without its drawbacks, however. For example, HMOS places very great demands on a manufacturer's ability to form extremely fine patterns accurately and reproducibly. The production of VMOS devices requires the use of two relatively high cost processes, epitaxial deposition and anisotropic etching. DMOS, in which the driver's channel is defined by successive diffusions of p-type and n-type impurities through the same mask opening, requires precision diffusion sources and superior process control to achieve narrow channel widths reproducibly. In addition, both HMOS and DMOS share the disadvantage (where maximum packing density is needed) of being planar processes, which require more wafer surface than non-planar processes such as VMOS.

Accordingly, a principal object of the present invention is to provide a new, high performance enhancement/depletion-mode inverter structure adapted for large and very large scale integration.

A related object of this invention is to provide an improved method for fabricating such devices economically and with a minimum of critical processing steps.

Another object of this invention to provide nonplanar e/d-type MOS inverters by a method that does not include anisotropic etching.

A further object is to provide an improved method of forming silicon gate e/d-type inverters having extremely short channel length drivers.

SUMMARY OF THE INVENTION

These and other objects of the present invention are achieved by the provision of a novel MOS inverter that includes a self-aligned silicon gate depletion-mode load device integrated in series with a nonplanar, submicron channel enhancement-mode device similar in configuration to one disclosed in application Ser. No. 862,715, filed Dec. 21, 1977 by Shuichi Sato et al. and assigned to the assignee of the present invention.

In accordance with an illustrated embodiment of the invention, such a structure is suitably provided by a method that begins with formation of an oxygen-impermeable mask on a selected portion of an already-oxidized semiconductor wafer surface. Unmasked areas of the surface are heavily oxidized in a subsequent step to provide a thick, recessed local oxide layer having a tapered edge, or "beak", extending beneath the margin of the oxygen-impermeable mask. Such local oxidation of the masked wafer creates a semiconductor plateau with sloped sides on the wafer surface. After removing the mask, ions of a p-type impurity are implanted in the plateau through the overlying oxide layer, including a portion of the oxide beak, to provide a thin, buried layer having an upturned edge. This edge, which forms the channel of the enhancement-mode driver, terminates at the sloped side of the plateau. Ions of an n-type impurity are then implanted through the same oxide layer to provide an n+ source region in the plateau above and self-aligned with the channel-forming layer. After removing the oxide coating, a thin oxide film is formed on the wafer surface, and areas overlying the future site of the load device are masked off. N-type ions are implanted through the unprotected portion of the film to form an n− drift region along the slope below the driver's channel-forming layer. A second n-type implant through the film after removal of the protective mask is made to adjust the threshold voltage of the subsequently formed load device. Polysilicon gates are next formed overlying the channel and drift region of the driver and the channel of the load device, and rendered conductive by an n-type implant that simultaneously forms n+ source and drain regions in the wafer. Finally, an insulating oxide coating is applied and metal interconnection patterns defined to complete fabrication of the novel e/d-mode inverter.

DESCRIPTION OF PREFERRED EMBODIMENT

Figure 1:
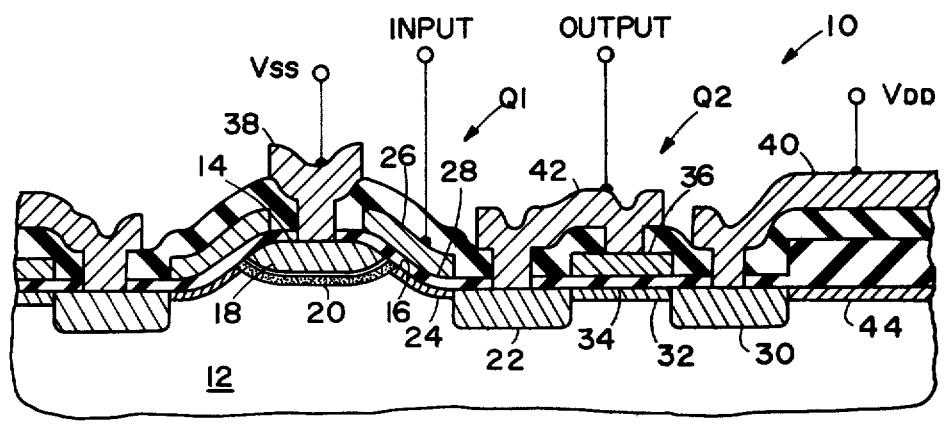
FIG. 1 is a cross-sectional view of an enhancement/depletion-type MOS inverter according to a preferred embodiment of the present invention.

Referring now to the drawings, and first to FIG. 1 thereof, an n-channel MOS inverter structure in accordance with the best mode presently contemplated for practicing the invention is shown in cross-section at 10. Inverter structure 10 includes an integrated series pair of MOS field effect transistors—a nonplanar, short channel enhancement-mode switching device, or driver, Q1 and a planar depletion-mode load device Q2. Transistors Q1 and Q2 are formed at the upper surface of a lightly doped p-type silicon wafer, or substrate, 12. As will be understood, the portion of substrate 12 shown in the figure is but a very small portion of a complete wafer, which in a typical LSI application could contain thousands of transistors.

Driver transistor Q1 is formed in a nonplanar field of the substrate surface that includes an elevated portion, or plateau, 14 and an adjoining slope 16 formed by a local oxidation process in a manner to be described. Extending into the substrate at the top of plateau 14 is an n+ source region 18. A very thin (<1 micron) implanted p-type layer 20 is disposed just beneath source region 18, and includes an upturned margin that terminates at slope 16 and forms a channel region for the device. As will be seen in the figure, channel-forming layer 20 has a profile that essentially is a complement of the overlying substrate surface. Although layer 20 is depicted as being of nearly uniform thickness, in actuality the upturned margin tapers in thickness to provide a channel width (measured along slope 16) in the range of about 0.3 to about 0.9 microns, typically about 0.4 to 0.5 microns. An n+ region 22 that forms the drain region for transistor Q1 extends into substrate 12 at a location adjacent the foot of slope 16 as shown. Stretching along the surface of slope 16 between layer 20 and n+ region 22 is an implanted n− drift region 24. A conductive layer 26 of heavily doped polycrystalline silicon (polysilicon) overlies the channel and drift region, and serves as the gate of switching transistor Q1. Separating and insulating the gate from the surface of substrate 12 is a thin gate oxide layer 28.

Adjoining (and integrated with) transistor Q1 in a substantially planar field of the substrate surface adjoining slope 16 is load transistor Q2, which shares n+ region 22 with the driver. Extending into the substrate at a location spaced from region 22, which forms the source region for transistor Q2, in an n+ drain region 30. An n− region 32 stretching along the surface of substrate 12 between n+ regions 22 and 30 defines the channel for the depletion mode load device. Channel region 32 suitably has a width of about 5 to 6 microns. Overlying the channel region and separated from it by a thin gate oxide layer 34 is a conductive polysilicon layer 36 that serves as the gate of load transistor Q2.

Figure 2:
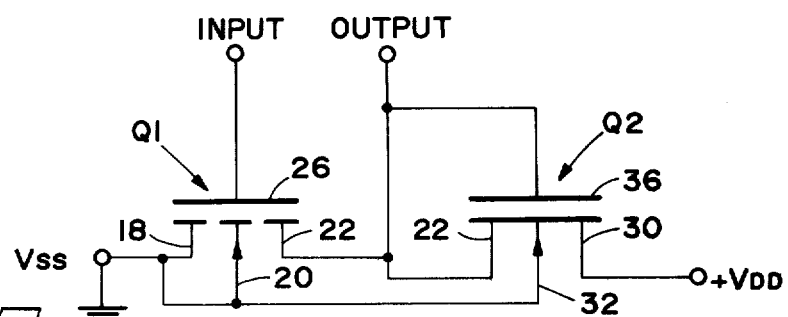
FIG. 2 is an electrical schematic diagram of the structure shown in FIG. 1.

The inverter structure further includes a metallization pattern layer 38 in contact with Q1 source region 18, and a second metallization pattern layer 40 in contact with Q2 drain region 30. Metal layer 40 is connected in a suitable manner to a positive voltage (Vdd) source for operation of the inverter; metal layer 38 is connected as indicated to Vss, or ground. The gate of transistor Q2, and Q1 drain/Q2 source region 22 are interconnected by a third metallization pattern 42. Digital data input signals are applied via a conductor pattern (not shown) to gate electrode 26 of the switching transistor. Inverted output signals are taken from metal pattern 42, as indicated. As will be understood, substrate 12 is electrically connected Vss, or ground, in a suitable manner. FIG. 2 shows the resulting arrangement in electrical schematic form.

It will be noted in FIG. 1 that the gate electrode of driver transistor Q1 overlaps a portion of source region 18. This is done to maximize transconductance at microwave frequencies. Overlap of the transistor's drain region should be avoided to minimize gate-to-drain capacitance, however. In addition, a shallow p-type region 44 suitably is formed over portions of the substrate surface outside structure 10 for the purpose of preventing unwanted or parasitic MOS devices. Such regions are conventional and are usually referred to as "channel stoppers."

Figure 3:
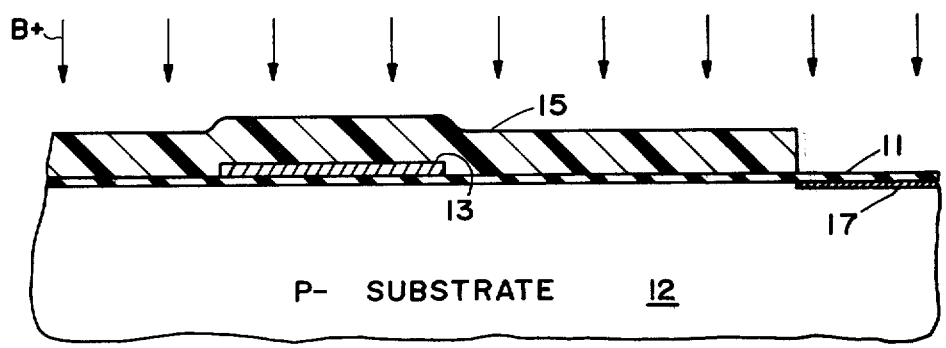
FIGS. 3-9 illustrate successive steps in the manufacture of the FIG. 1 structure.

Referring to FIGS. 3–9, a process for making the e/d-mode MOS inverter structure of FIG. 1 will now be described. It should be understood that the figures are intended to be illustrative, and are not drawn to scale. The starting material is a wafer 12 of p-doped, [100] oriented monocrystalline silicon having a resistivity of about 60 to 80 ohm-cm. After appropriate cleaning, the surface of the wafer is thermally oxidized to provide an oxide layer 11 on the upper surface. Layer 11 suitably has a thickness of about 300 to 600 angstroms, more typically 400–500 angstroms. Next, an oxygen-impermeable layer of silicon nitride ($Si_3N_4$) is formed overlying the oxide layer, and photopatterned by conventional means to provide a mask 13 at a selected location on the wafer where a plateau is to be created in a subsequent step. The nitride layer may be in the range of about 0.1 to 0.2 microns, typically about 0.13 microns thick. After the mask is formed, a photoresist pattern 15 is provided covering mask 13 and surrounding areas of the substrate. The wafer is then subjected to an ion implant step, with boron ions being implanted through oxide layer 11 into unmasked areas of substrate 12, as shown in FIG. 3. The boron implant is at 60 KeV with a dosage of about $8 \times 10^{13}/cm^2$, and forms a shallow p-type region 17 along the surface of the wafer outside the area where the inverter is to be fabricated.

Figure 4:
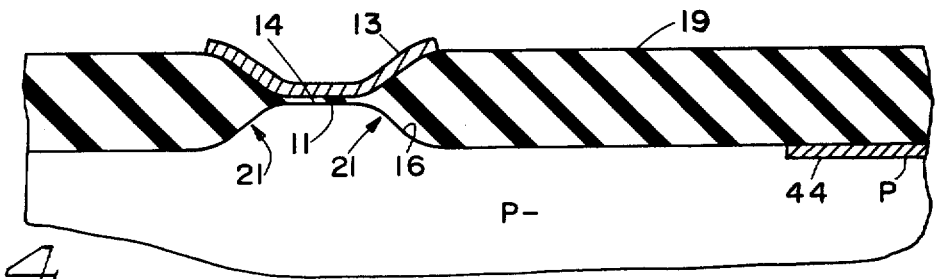

After the boron field implant, photoresist pattern 15 is removed and a very thick (about 2 microns) local oxide layer 19 is grown in the areas surrounding $Si_3N_4$ mask 13 by subjecting the wafer to a wet oxidizing atmosphere at about 1000° C. for 24 hours. A portion of the silicon surface is consumed in the oxidation process, recessing the surface of wafer 12 except where it is protected by mask 13. This results in the formation of a plateau 14 on the wafer surface. As is known, local oxidation of a silicon surface masked by a nitride-oxide duplex layer (i.e. layers 13, 11) produces oxide "beaks" 21 that extend beneath the margin of the oxygen-impermeable $Si_3N_4$ layer. As shown in FIG. 4, these beaks provide a smoothly tapered transistion in thickness between local oxide layer 19 and the portion of original oxide layer 11 protected by mask 13, thereby producing slopes 16, 16' along the sides of plateau 14. The formation of such beaks is described by Appels et al. in *Philips Research Reports*, Vol. 26, No. 3, pp. 157–165. During the local oxidation step, the previously implanted boron ions diffuse out to form p-type channel-stopping region 44.

Figure 5:
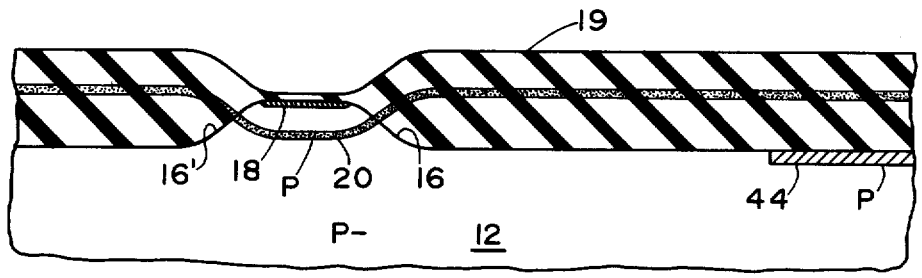

Nitride mask 13 is now removed and a very thin layer 20 of a p-type impurity, preferably boron, is implanted in substrate 12 and the overlying oxide layer. As shown in FIG. 5, the contour of the implanted layer substantially matches the upper surface contour of the oxide coating, since the ion penetration resistance of silicon and $SiO_2$ is about the same. By controlling the penetration depth in a known manner, boron ions are implanted at a depth such that the resulting p-type layer 20 extends through plateau 14, crossing slopes 16, 16' as shown. A boron ion dosage of about $8 \times 10^{12}/cm^2$ implanted at 400 KeV is suitable in this application. Next, an n-type impurity, preferably arsenic, is implanted in plateau 14 through the same variable thickness oxide layer to form an n+ source region 18 overlying layer 20. Again, by adjusting the acceleration potential, arsenic ions are made to penetrate the thin oxide layer 11 overlying the top of plateau 14, but not the thicker local oxide layer 19. An arsenic dosage of about $5 \times 10^{15}/cm^2$ at 200 KeV is suitable.

Figure 6:
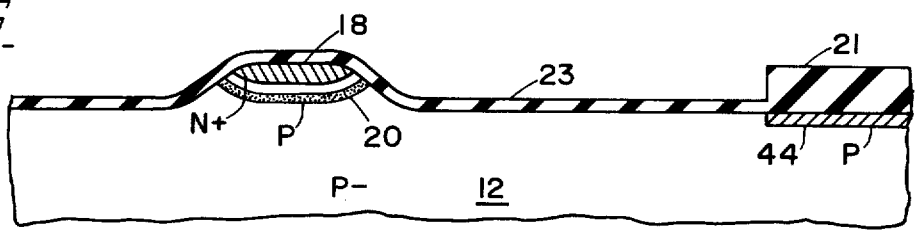

Referring next to FIG. 6, oxide layers 11 and 19 are removed, and an $SiO_2$ layer 21 is deposited over the entire surface of wafer 12 by chemical vapor deposition (CVD) to a thickness of about one micron. A selected portion of the CVD oxide layer is then removed by photoetching to expose adjoining planar and nonplanar fields of the substrate surface where the inverter transistors are to be formed. Next, a thin (about 900 angstroms) oxide film 23 is thermally grown over the wafer surface areas exposed by the opening in layer 21.

Figure 7:
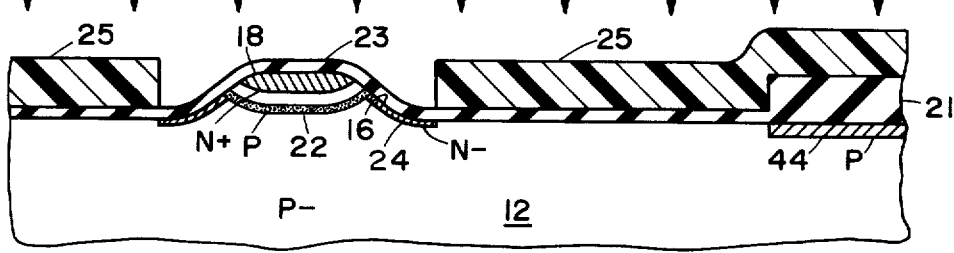
Figure 8:
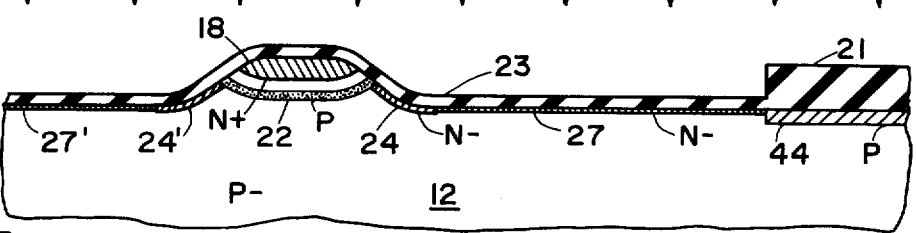

After providing a photoresist masking layer 25 on the wafer, leaving plateau 14, slopes 16, 16' and the overlying portion of oxide film 23 uncovered as shown in FIG. 7, the next step in the process is the formation of an n− drift region 24 along slope 16. This is accomplished by implanting an n-type impurity, preferably phophorus, in the wafer surface beneath the uncovered portion of oxide film 23. A phosphorus implant at 150 KeV and a dosage of about $1.7 \times 10^{12}/cm^2$ is suitable, and simultaneously adjusts the gate threshold voltage of the enhancement mode switching device. Next, referring to FIG. 8, photoresist layer 25 is removed and the wafer is again subjected to an ion implant step in which a shallow surface layer 27 of an n-type impurity (again, preferably phosphorus) is provided in the planar field where depletion mode device Q2 is to be formed. As will be evident, a portion of n-type layer 27 will become channel region 32 of the load transistor. This second phosphorus implant serves to adjust the threshold voltage of the load device, as well as to complete adjustment of the switching transistor's threshold voltage.

Figure 9:
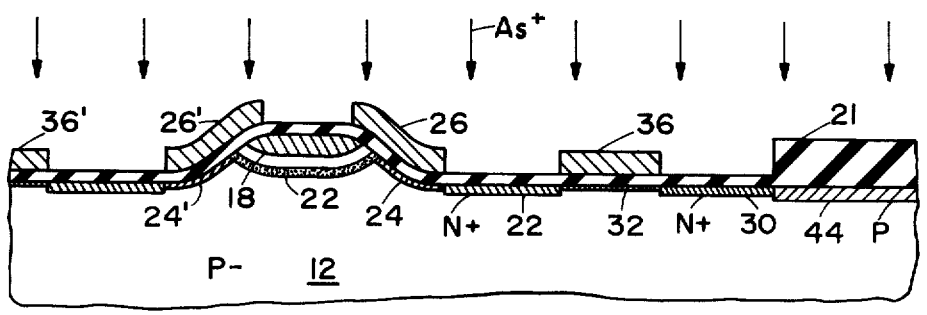

Referring now to FIG. 9, polycrystalline silicon is deposited on the oxide-covered surface of wafer 12 to a thickness of about 5000 angstroms, then photoetched to provide polysilicon strips 26 and 36 that will ultimately become gate electrodes for transistors Q1 and Q2. As will be seen in the figure, polysilicon strip 26 is disposed on slope 16 and overlies the surface termination of implanted layer 22 and drift region 24, as well as a portion of n+ source region 18. Polysilicon strip 36 overlies a section of implanted n− surface region 27 in the planar field adjoining slope 16. Ions of an n-type impurity, preferably arsenic, are then implanted in the portions of wafer 12 that are not protected either by polysilicon strips 26, 36 or by CVD oxide layer 21. The arsenic ions, which suitably are implanted at a potential of 200 KeV and a dosage of about $5 \times 10^{15}/cm^2$, penetrate the exposed areas of thin oxide film 23 and form n+ regions 22 and 30 adjoining the surface of wafer 12. At the same time, the arsenic ions implanted in the polysilicon strips render them highly conductive.

A CVD silicon dioxide layer 29 (FIG. 1) is now formed over the entire surface of the wafer to a thickness of about 6000 angstroms, after which the wafer is annealed in a dry nitrogen atmosphere at 1000° C. for about 30 minutes. This is done to heal damage to the silicon wafer's crystalline structure caused by the ion implantation and to diffuse and distribute the implanted ions. Finally, a layer of aluminum is deposited on the wafer surface to a thickness of about 1.5 microns, then photoetched to provide the desired metallization pattern layers 38, 40 and 42.

The thus-formed integrated circuit includes a nonplanar enhancement-mode switching device Q1 having a submicron length (about 0.3 to 0.9 microns) channel that is self-aligned relative to source region 18. The length of the channel, which is defined by the width of layer 22 at its point of abutment with slope 16, can be controlled by changing the angle of the slope (which is determined by the thickness of local oxide layer 19) and the phosphorus ion dosage in the n− drift region. Gate threshold voltages also are controlled by the phosphorus ion implants (FIGS. 7 and 8) as previously mentioned (as well as by the doping level of the substrate, of course). In the described embodiment, the threshold voltages suitably are about 0.6 to 1.0 volt for the submicron channel enhancement-mode device and −2 volts for the depletion-mode device. The inverter of the present invention is more compact than prior art e/d-type inverter structures, and thus provides greater packing density. In addition, because the switching device can be fabricated with extremely short channel lengths (in the range of about 0.3 to 0.9 microns), high frequency performance is improved. These benefits are provided by a relatively simple process that does not require the use of extremely demanding photolithography or highly precise differential diffusion to achieve short channel lengths, and which eliminates the need for anisotropic etching and high purity epitaxial deposition procedures.

While the best mode presently contemplated for practicing the invention has been described with reference to a specific embodiment, various modifications and changes will no doubt become apparent to persons skilled in the art. It is therefore, intended that the appended claims cover any such modifications as fall within the true scope of the invention.

We claim as our invention:

1. A monolithic metal-insulator-semiconductor inverter circuit structure of the combined enhancement/depletion-mode type, comprising:

a body of semiconductor material predominantly of one conductivity type, said body having a major surface that includes a substantially planar field and an adjoining nonplanar field with surface portions of relatively higher and lower elevation joined by a slope, an enhancement-mode field effect device at least partially formed within said nonplanar surface field, said device including (a) a first, heavily doped region of the other conductivity type extending into said body at said higher surface portion, (b) a second, heavily doped region of said other conductivity type extending into said body at said lower surface portion, said first and second regions respectively constituting source and drain regions for said enhancement-mode device, (c) a thin layer of said one conductivity type formed by implantation within said body beneath said first impurity region and including an upturned margin that terminates at said slope and constitutes a channel region for said device, (d) a third, more lightly doped region of said other conductivity type extending along said body surface between said channel region and drain region and constituting a drift region for said device, (e) a first insulating layer disposed over a portion of the body surface in said nonplanar field, including the portion extending between said first and second regions, and (f) a first gate electrode disposed on said first insulating layer overlying said channel and drift regions, and a depletion-mode field effect device integrated with said enhancement-mode device, and including (a) a fourth, heavily doped region of said other conductivity type extending into said body within said planar field at a location spaced from said second region by (b) a fifth, more lightly doped region of said other conductivity type, said second and fourth and fifth regions respectively constituting source, drain and channel regions for the depletion mode device, (c) a second insulating layer disposed over a portion of the body surface in said planar field, including the portion extending between said second and fourth regions, and (d) a second gate electrode disposed on said insulating layer overlying said fifth region.

2. The circuit structure of claim 1, wherein said one conductivity type is p-type conductivity and said opposite conductivity type is n-type conductivity.

3. The circuit structure of claim 1, wherein said gate electrodes are of electrically conductive polycrystalline silicon.

4. The circuit structure of claim 1, wherein the predominant impurity in said first, second and fourth regions is arsenic, the predominant impurity in said second region is boron, and the predominant impurity in said third and fifth regions is phosphorus.

5. The circuit structure of claim 4, wherein said first, second, fourth and fifth regions are formed by ion implantation of the respective predominant impurity for said regions.

* * * * *